United States Patent
Sumida et al.

(10) Patent No.: US 7,633,981 B2
(45) Date of Patent: Dec. 15, 2009

(54) REVERSE OXIDATION POST-GROWTH PROCESS FOR TAILORED GAIN PROFILE IN SOLID-STATE DEVICES

(75) Inventors: David S. Sumida, Los Angeles, CA (US); Kevin W. Kirby, Calabasas Hills, CA (US)

(73) Assignee: Raytheon Company, Waltham, MA (US)

( * ) Notice: Subject to any disclaimer, the term of this patent is extended or adjusted under 35 U.S.C. 154(b) by 648 days.

(21) Appl. No.: 11/584,695

(22) Filed: Oct. 20, 2006

(65) Prior Publication Data
US 2008/0165817 A1   Jul. 10, 2008

(51) Int. Cl.
*H01S 3/14* (2006.01)
(52) U.S. Cl. .................. 372/39; 372/41; 372/6
(58) Field of Classification Search ............ 372/40, 372/10; 359/326; 438/22
See application file for complete search history.

(56) References Cited

U.S. PATENT DOCUMENTS 6,891,878 B2 * 5/2005 Spariosu et al. ............ 372/70
6,996,136 B1   2/2006 Byren et al.
6,996,137 B2 * 2/2006 Byren et al. .............. 372/10
2007/0242714 A1 * 10/2007 Sumida et al. ............. 372/40

OTHER PUBLICATIONS

Krey, M. & Becker, K, "An Optical In-Situ Study Of The Re-Oxidation Kenetics Of Mixed Valent Yb3al5o12", Phys. Chem. Chem. Phys. 5, 2283-2290 (2003).

* cited by examiner

*Primary Examiner*—Minsun Harvey
*Assistant Examiner*—Tuan N. Nguyen
(74) *Attorney, Agent, or Firm*—Leonard A. Alkov

(57) ABSTRACT

A laser rod is provided having a tailored gain profile such that the quality of the output beam is enhanced. The laser rod has a concentration of active substitutional ions that is relatively high at the center of the rod and decreases to the surface of the rod. The laser rod further has a concentration of pre-active laser ions that is relatively high at the surface of the rod and decreases to the center of the rod. Methods are disclosed for creating a layer of inactive laser species in the near surface region of a laser rod using substitutional dopant ions and for creating a laser rod with a tailored gain profile such that the quality of the output beam is enhanced.

12 Claims, 3 Drawing Sheets

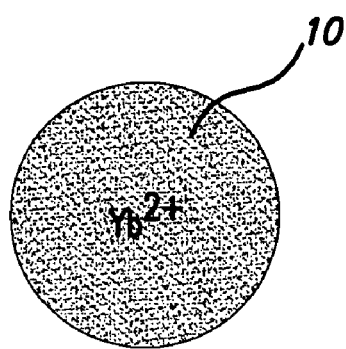
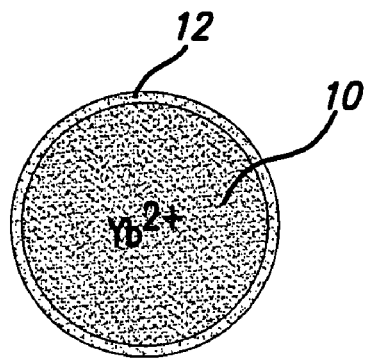
FIG. 1a
FIG. 1b
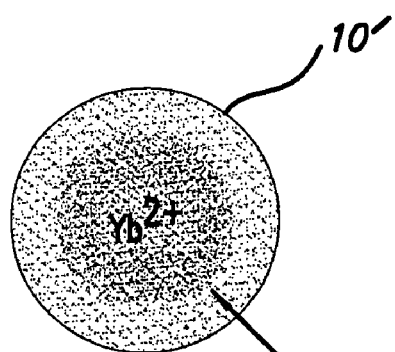
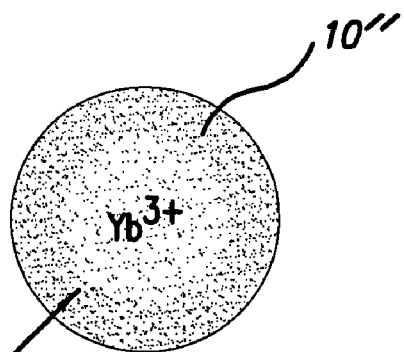
FIG. 1c       M = $Y^{3+}$, $Zr^{4+}$       FIG. 1d

REVERSE OXIDATION POST-GROWTH PROCESS FOR TAILORED GAIN PROFILE IN SOLID-STATE DEVICES

CROSS-REFERENCE TO RELATED APPLICATION

The present application is related to application Ser. No. 11/584,691, filed concurrently herewith and entitled "Enhanced Beam Quality from a Laser Rod Using Interstitial Dopants" [PD-06W020]. That application is directed to an interstitial process for tailoring the profile of the laser rod.

TECHNICAL FIELD

The present invention is directed to the improvement of beam quality of a laser resonator, and, more specifically, to modifying the radial gain profile within a laser rod used in such laser resonator.

BACKGROUND ART

In order to control the mode quality of the output beam from a laser resonator, it is a common technique to take laser rods having a uniform concentration as received from the supplier and use additional optical components within the laser resonator. Such additional components may include hard or apodizing apertures. The disadvantage of such an approach is the necessity of using these additional optical components, which adds complexity, cost, and additional optical surfaces susceptible to optical damage.

A recent patent by Robert W. Bryen and David S. Sumida entitled "Solid State Devices with Radial Dopant Valence Profile" (U.S. Pat. No. 6,996,137, issued Feb. 7, 2006) suggests that the concentration of active laser ions in the near surface region may be decreased by treating the laser rods in a reducing environment at high temperature. The associated mechanism with this treatment is the removal of oxygen ions from the structure that results in a valence reduction of active laser ions in the same region. The valence reduction changes the active ions to an inactive state with respect to the desired optical absorption required for lasing. While this approach has proven to be valid, the process relies on the diffusion of oxygen vacancies into the host structure to create a layer of decreased active ion concentration. Due to the slow diffusion rate of the vacancies, the process affects only a very small near surface region of the laser rod. Calculations show that at temperatures near the melting point of the host, a time period of greater than 10 days is required to affect 50% of the active ions in a layer less than 0.1 mm in thickness from the surface. This process is therefore too slow to be effective for the desired change in the laser rod.

The facile process of using an oxidation step to convert $Yb^{2+}$ to $Yb^{3+}$ ions in a YAG host has been previously been disclosed by M. Kreye and K. Becker, "An optical in-situ study of the re-oxidation kinetics of mixed valent $Yb_3Al_5O_{12}$", Phys. Chem. Chem. Phys. 5, 2283 (2003). However, Kreye et al report only the process parameters necessary to create the oxidation. Hence, their process produces the opposite concentration profile and not the laser active concentration profile desired as taught in the present invention.

DISCLOSURE OF INVENTION

In accordance with an embodiment of the present invention, a method is provided for creating a layer of inactive laser species in the near surface region of a laser rod using substitutional dopant ions. The method comprises:

providing an as-grown reduced-valence-state laser rod having pre-active substitutional ions therein;

placing pre-selected chemical constituents into intimate contact with the surface of the laser rod; and diffusing the substitutional dopant ions into the laser rod as substitutional ions taking the place of the laser pre-active substitutional ions that reside in the laser rod to effect an exchange process, thereby forming a tailored concentration profile of pre-active laser ions in the laser rod, wherein the concentration of pre-active laser ions is higher in the central region as compared to the peripheral region.

In accordance with another embodiment of the present invention, a method is provided for creating a laser rod with a tailored gain profile such that the quality of the output beam is enhanced. The method comprises:

providing an as-grown reduced-valence-state laser rod having pre-active substitutional ions therein;

placing pre-selected chemical constituents into intimate contact with the surface of the laser rod;

diffusing the substitutional dopant ions into the laser rod as substitutional ions taking the place of the laser pre-active substitutional ions that reside in the laser rod to effect an exchange process, thereby forming a tailored concentration profile of pre-active laser ions in the laser rod, wherein the concentration of pre-active laser ions is higher in the central region as compared to the peripheral region; and subjecting the laser rod to an oxidizing atmospheric soak at a predetermined temperature and time period to thereby convert the pre-active laser ions into active laser ions with the appropriate concentration profile.

In accordance with yet another embodiment of the present invention, a laser rod is provided having a tailored gain profile such that the quality of the output beam is enhanced. The laser rod has a concentration of active substitutional ions that is relatively high at the center of the rod and decreases to the surface of the rod. The laser rod further has a concentration of pre-active laser ions that is relatively high at the surface of the rod and decreases to the center of the rod.

BRIEF DESCRIPTION OF THE DRAWINGS

FIGS. 1a-1d illustrate the spatial profile of a laser rod from the end view in each of the four steps, namely, the as-grown reduced rod with reduced $Yb^{2+}$ (FIG. 1a), the constituent chemical species M applied around the periphery of the rod (FIG. 1b), following the first heat treatment (FIG. 1c), and in the final heat treatment under oxidizing conditions (FIG. 1d);

BEST MODES FOR CARRYING OUT THE INVENTION

Figure 2A:
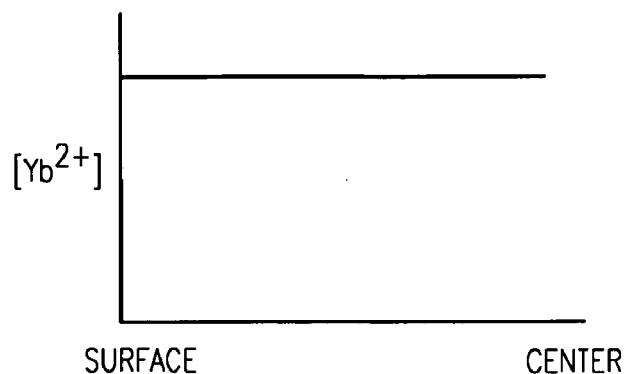
FIGS. 2a-2c, on coordinates of concentration and distance, are plots that illustrate the dopant profiles, from the surface inward towards the center, for an embodiment using a trivalent species, for the initial $Yb^{2+}$ concentration in the as-grown reduced rod (FIG. 2a), the trivalent dopant $Y^{3+}$ profile after first heat treatment (FIG. 2b), and the final $Yb^{3+}$ ion concentration after final heat treatment (FIG. 2c)

In accordance with an embodiment of the present invention, certain chemical constituents are placed into intimate contact with the surface of an as-grown "reduced-valence-state" laser rod for the purpose described below. Using a specific heat treatment, these elements diffuse into the laser element as substitutional ions taking the place of the laser "pre-active" substitutional ions that reside on those sites, i.e., an exchange process. As these new ions migrate into the lattice and exchange with the pre-active ions, the concentration of pre-active laser ions is decreased, beginning at the near-surface periphery region. In so doing, a tailored concentration profile of pre-active laser ions is created in the laser element through this novel post-growth process, wherein the concentration is now higher in the middle central region as compared to the outer peripheral zone. Having created a specific concentration profile of the appropriate pre-active laser ions, the laser element is then subjected to an oxidizing atmospheric soak at a predetermined temperature and time period. This oxidation step converts the pre-active laser ions into "active" laser ions ready for use in a laser resonator. As a consequence of this concentration profile, the pump absorption and gain profiles become peaked along the rod longitudinal axis. Therefore, the rod acts as "soft" apodizing aperture in a laser resonator, and serves to discriminate against higher order resonator modes. Hence, the output beam quality improves and the elimination of higher modes (with associated higher peak intensities) also prevents optical damage within the laser resonator.

In the present invention, the rod serves a dual function of active gain medium as well as the apodizing aperture.

The teachings of the present invention are directed to modifying the radial gain profile within a laser rod so as to improve the beam quality of a laser resonator when such a modified rod is inserted therein. More specifically, the present invention teaches a method wherein the laser-ion profile is tailored in the transverse dimension of a laser rod (relative to its longitudinal axis) so that the ionic concentration is minimized at the radial periphery (i.e., the near surface region) as compared to the ionic concentration along the longitudinal axis (i.e., down the center of the rod). In so doing, the pump profile (and associated gain profile) varies radially from center to edge in accordance with the concentration profile. Such a radial-dependent gain profile within the rod serves as an apodizing "soft" aperture when placed within a laser resonator. Hence, the output beam quality from such a resonator will be improved as compared to an identical resonator under the same pumping conditions with a laser rod with uniform concentration (i.e., no radial dependence to the concentration). The teachings of the present invention apply to other laser medium geometries as well (e.g., slabs and disks).

The novel aspects of the present invention regarding the key fabrication and processing steps are described in more detail as follows. The processing sequence begins by placing certain chemical constituents into intimate contact with the surface of an as-grown reduced-valence-state laser rod. Using a prescribed heat treatment, these elements diffuse into the laser element as substitutional ions taking the place of the laser-pre-active substitutional ions that reside on those sites, i.e., an exchange process. As these new ions migrate into the lattice and exchange with the pre-active ions, the concentration of pre-active laser ions is decreased beginning at the near-surface periphery region. In so doing, a tailored concentration profile of pre-active laser ions is created in the laser element through this novel post-growth process, wherein the concentration is now higher in the middle central region as compared to the outer peripheral zone. Having created a specific concentration profile of the appropriate pre-active laser ions, the laser element is then subjected to an oxidizing atmospheric soak at a predetermined temperature and time period. This oxidation step converts the pre-active laser ions into active laser ions with the appropriate concentration profile, making the laser rod ready for use in a laser resonator.

An example of such a laser system is Yb:YAG. In this system, $Yb^{3+}$ ions, doped in the YAG host at the yttrium sites, are the laser active ions, i.e., excited by incident pump photons to induce lasing. Conversely, when Yb ions are in the 2+ or divalent state, the associated spectroscopic features (e.g., absorption and emission cross sections) change dramatically, and the $Yb^{2+}$ ions are no longer laser active. These are the so-called "pre-active" laser ions. For this embodiment, the rod or laser element must start in an as-grown reduced valence condition. That is, the rod must contain a large percentage of reduced $Yb^{2+}$ ions in its as-grown state. Such laser rods typically have as high an oxygen vacancy as possible, and the $Yb^{2+}$ concentration is twice the oxygen vacancy.

This reduced state is indicated by a bluish tint to the YAG boule, as distinct from the normal trivalent state, which results in a clear transparent boule with little or no color whatsoever. This type of "pre-conditioned" rod is commercially available from solid-state crystal growers.

In order to promote the exchange process in this case, the specific chemical constituents to be applied around the outer surface of the laser rod are, for example, yttrium sources such as YAG, $Y_2O_3$, or yttrium metal. The key requirement is to employ a constituent that will readily diffuse into the crystal lattice and substitutionally place itself on the yttrium trivalent site. An alternative embodiment is the use of a tetravalent species that leads to an enhanced profile as described in detail below.

In the next step, the rod, along with its applied chemical constituent, is heat treated to drive these constituents into the host and to exchange with the $Yb^{2+}$ ions on substitutional yttrium sites. The temperature range of heat treatment must be high enough to cause diffusion, but below the melting point of the laser rod. Consistent with these considerations, a temperature in the range of about 500° to 1900° C. may be employed for Yb:YAG. The range of time of heat treatment should be sufficient, in conjunction with the temperature, to cause diffusion. Consistent with these considerations, a time of several days may be required at the lower end of the temperature range, while about 1 hour may be sufficient at the upper end of the temperature range. The heat treatment is carried out in an inert atmosphere or vacuum. At the lower end of the temperature range, any of the inert gases, such as helium, nitrogen, argon, and the like may be used. Due to possible reactions at the higher end of the temperature range, helium may be used.

The result of this heat treatment step is to preferentially remove the Yb ions nearest the surface of the laser element and replace them with non-laser active species. Hence, the newly formed $Yb^{2+}$ spatial profile, at first uniform, is now non-uniform with a roll-off in concentration from center to edge of the rod.

Now that the non-uniform spatial profile is fixed, the remaining step is to convert the pre-active $Yb^{2+}$ ions into laser active ions by promoting the valence from 2+ to 3+. This conversion is accomplished by a second heat treatment, or oxygen soak, of the laser element. Unlike the first heat treatment, this treatment is in an oxidizing atmosphere, such as oxygen or air. This oxygen soak is typically performed within the same temperature range as the first heat treatment step described above.

This is a relatively easy process, as the oxygen readily diffuses throughout the entire laser element, and oxidizes the Yb ions into the proper $Yb^{3+}$ state. Indeed, while the time required may take some days at the lower end of the temperature range, the time required at the upper end of the temperature range may be on the order of minutes.

This oxidation step is significantly easier to do than the reverse process, i.e., reduction, and hence, this is a key reason for the efficacy of this approach. The spatial profiles are depicted in FIGS. 1a-1d and 2a-2c.

FIGS. 1a-1d illustrate the spatial profile of a laser rod from the end view in each of the four steps outlined in the text.

FIG. 1a is an end view of the laser rod 10, which is an as-grown reduced rod with reduced $Yb^{2+}$.

In FIG. 1b, the constituent chemical species M 12 is applied around the periphery of the rod. M may be $Y^{3+}$ or $Zr^{4+}$, for example.

After the first heat treatment, as described above, the exchange process has removed Yb ions from the surface and created a spatial profile of $Yb^{2+}$ ions with M ions, as shown in FIG. 1c, resulting in an altered rod 10'.

After the final heat treatment under oxidizing conditions, the $Yb^{2+}$ ions are converted to $Yb^{3+}$, while the M ions are unaffected, as shown in FIG. 1d, resulting in a further altered rod 10". The spatial profile either is maintained in the case of a trivalent substitutional species such as $Y^{3+}$, or the spatial profile is enhanced in the case of a tetravalent substitutional species such as $Zr^{4+}$.

Figure 2B:
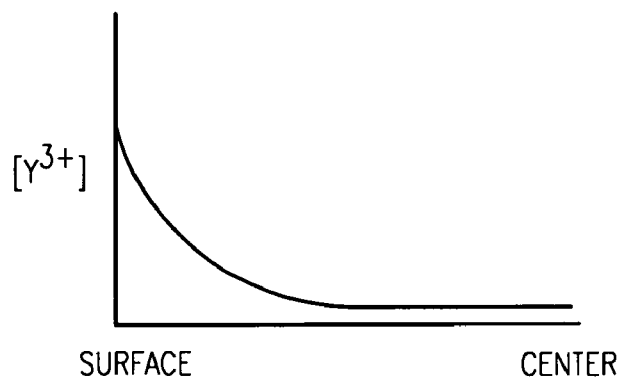
Figure 2C:
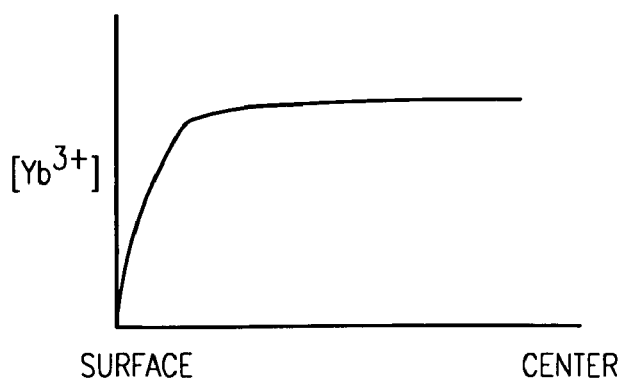

FIGS. 2a-2c show the dopant profiles, from the surface inward towards the center of the rod 10, for the first embodiment using a trivalent species such $Y^{3+}$. FIG. 2a shows the initial Yb concentration in the as-grown reduced rod 10. FIG. 2b shows the trivalent dopant $Y^{3+}$ profile after first heat treatment (rod 10'). FIG. 2c shows the final $Yb^{3+}$ concentration after final heat treatment (rod 10").

As a consequence of the foregoing sequence of steps, the treated rod or laser element 10" now contains both the correct spatial profile and the correct laser active valence ions. Once placed into a laser resonator, its "in situ" apodizing aperture allows for higher beam quality of the output beam as stipulated by the ultimate goal of this disclosure.

Another embodiment using an alternative chemical constituent involves the use of a tetravalent ion based on, for example, zirconium, Zr. The key difference between this alternative embodiment and the previous embodiment is in the final spatial profile following the second heat treatment. Specifically, the advantage here is that the laser active concentration near the outer surface will be further decreased (relative to the first embodiment) due to the interaction of the tetravalent ions with the Yb ions. This leads to an enhanced laser active profile (i.e., greater concentration of non-lasing species into the bulk) since the roll off in concentration at the edges will be accentuated. This interaction results from the fact that when the $Zr^{4+}$ substitutionally resides near an Yb ion, the charge balance of the nearest-neighbor pair of cations must be 6+ to satisfy the local crystal field. In the case of two Yb ions, this would result in a pair of $Yb^{3+}$ ions. In the case with the tetravalent ion however, its exceed charge of +1 forces the Yb ion to reduce to $Yb^{2+}$. Hence, the final profile exhibits a larger decrease in $Yb^{3+}$ concentration near the surface than would otherwise be the case. The spatial profiles are depicted in FIGS. 3a-3c.

Figure 3A:
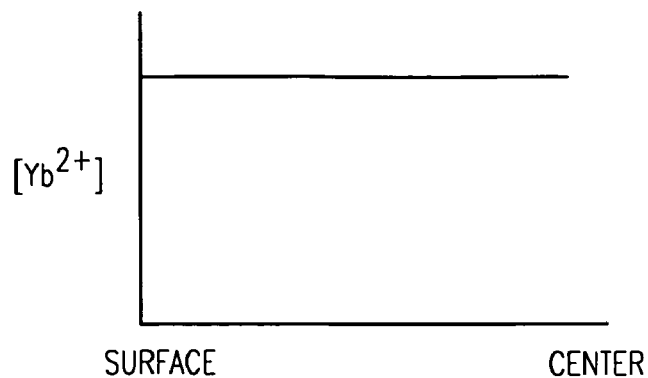
FIGS. 3a-3c, on coordinates of concentration and distance, are plots that illustrate the dopant profiles, from the surface inward towards the center, for another embodiment using a tetravalent species, for the initial $Yb^{2+}$ concentration in the as-grown reduced rod (FIG. 3a), the tetravalent dopant $Zr^{4+}$ profile after the first heat treatment (FIG. 3b), and (c) the final $Yb^{2+}/Yb^{3+}$ ion concentration after the final heat treatment (FIG. 3c).
Figure 3B:
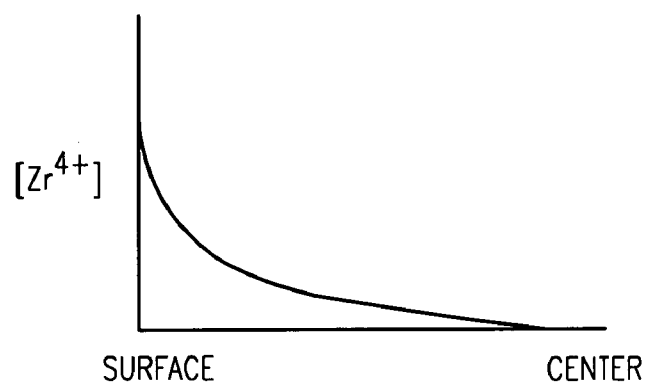
Figure 3C:
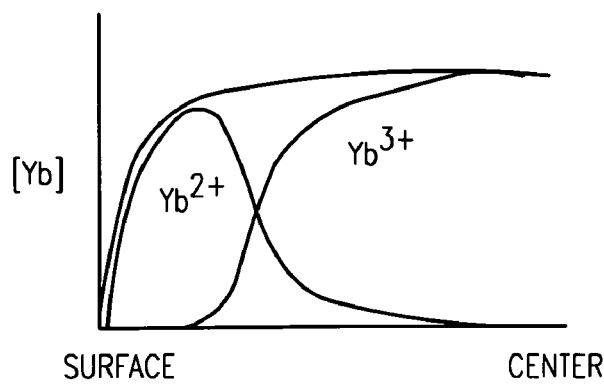

FIGS. 3a-3c shows the dopant profiles, from the surface inward towards the center of the rod 10, for the second embodiment using a tetravalent species such as $Zr^{4+}$. FIG. 3a shows the initial Yb concentration in the as-grown reduced rod. FIG. 3b shows the tetravalent dopant $Zr^{4+}$ profile after first heat treatment. FIG. 3c shows the final enhanced $Yb^{3+}$ concentration after final heat treatment. Note the additional presence of $Yb^{2+}$ near the surface due to satisfying the charge balance from nearest neighbor $Zr^{4+}$ as described above.

So in summary, the entire fabrication process requires four main steps. First, the rod 10 must be already in a reduced valence state. Second, a specific chemical constituent 12 is applied to the outer surface of the laser element 10. Third, the coated laser element 10 is heat treated so as to drive an exchange process whereby the constituent substitutionally replaces the pre-existing cation at the yttrium site. This treatment fixes the concentration profile of the Yb ions, albeit in the non-lasing valence state. Finally, in order to convert the $Yb^{2+}$ ions into laser active $Yb^{3+}$ ions, the laser element is heat treated again but this time in an oxidizing atmosphere to create the desired final absorption and gain profile.

An advantage of the present invention is the implementation of a process that is straightforward, economically viable, and independent of specific laser-crystal suppliers. Specifically, this process is intrinsically achieved in the laser rod by a post-growth treatment, thus removing the laser rod supplier from the critical processing path. The present invention does require that a variation of a standard laser rod be fabricated. However, past experience with crystal growth suppliers is that such rods are easily available, and in fact, such rods and boules may be purchased containing pre-active laser ions. In any case, the post-growth process clearly provides a competitive advantage to groups using the treated rods as opposed to those using the standard laser rods.

While the foregoing discussion is provided in terms of YAG, employing $Yb^{3+}$ as the lasing dopant species, it will be appreciated by those skilled in this art that other lanthanide aluminum garnet laser rods, doped with other dopant species may be employed as the as-grown reduced-valence-state laser rod. Examples of such laser rods, in addition to yttrium aluminum garnet (YAG) described above, include, but are not limited to, lutetium aluminum garnet (LuAG), gadolinium aluminum garnet (GAG), gadolinium gallium garnet (GGG), and the like. Dopants for such laser rods, in addition to ytterbium (Yb) described above, include, but are not limited to, neodymium (Nd), erbium (Er), thulium (Tm), holmium (Ho), and the like.

The foregoing discussion is directed to $Y^{3+}$ and $Zr^{4+}$ as the substitutional dopant species. Other substitutional dopant species may alternatively be used, so long as the species does not disturb the lasing profile, fits in the crystal lattice site in which it substitutes, and has one valence state. The determination of such other substitutional dopant species is not considered to constitute undue experimentation, based on the foregoing considerations and the teachings herein.

What is claimed is:

1. A method for creating a layer of inactive laser species in the near surface region of a laser rod using substitutional dopant ions, the laser rod having a central region and a peripheral region surrounding the central region, the method comprising: providing an as-grown reduced-valence-state laser rod having pre-active substitutional ions therein; placing a pre-selected chemical constituent into intimate contact with the surface of the laser rod, the pre-selected chemical constituents including the substitutional dopant ions; and diffusing the substitutional dopant ions into the laser rod as substitutional ions taking the place of the laser pre-active substitutional ions that reside in the laser rod to effect an exchange process, thereby forming a tailored concentration profile of pre-active laser ions in the laser rod, wherein the concentration of pre-active laser ions is higher in the central region as compared to the peripheral region; wherein the pre-active laser species is Yb2+; wherein the substitutional dopant species is Zr4+.

2. The method of claim 1 wherein the host laser rod is yttrium aluminum garnet (YAG).

3. The method of claim 1 wherein the substitutional dopant species is Y.sup.3+.

4. The method of claim 3 wherein the pre-selected chemical constituent including the yttrium is either crystalline or metal.

5. A method for creating a laser rod with a tailored gain profile such that the quality of the output beam is enhanced, the laser rod having a central region and a peripheral region surrounding the central region, the method comprising: providing an as-grown reduced-valence-state laser rod having pre-active substitutional ions therein; placing pre-selected chemical constituents into intimate contact with the surface of the laser rod, the pre-selected chemical constituents including substitutional dopant ions; diffusing the substitutional dopant ions into the laser rod as substitutional ions taking the place of the laser pre-active substitutional ions that reside in the laser rod to effect an exchange process, thereby forming a tailored concentration profile of pre-active laser ions in the laser rod, wherein the concentration of pre-active laser ions is higher in the central region as compared to the peripheral region; and subjecting the laser rod to an oxidizing atmospheric soak at a predetermined temperature and time period to thereby convert the pre-active laser ions into active laser ions and form the laser rod with the tailored gain profile; wherein the active ion species is Yb3+; wherein the substitutional dopant species is Y3+.

6. The method of claim 5 wherein the host laser rod is yttrium aluminum garnet (YAG).

7. The method of claim 5 wherein the yttrium source is either crystalline or metal.

8. The method of claim 5 wherein the dopant species is Zr.sup.4+.

9. A laser rod having a tailored gain profile such that the quality of the output beam is enhanced, the laser rod having a concentration of active substitutional ions that is relatively high at the center of the rod and decreases to the surface of the rod and having a concentration of pre-active laser ions that is relatively high at the surface of the rod and decreases to the center of the rod; wherein the active ion species is Yb3+ wherein the dopant species is Y3+.

10. The laser rod of claim 9 wherein the host laser rod is yttrium aluminum garnet (YAG).

11. The laser rod of claim 9 wherein the yttrium source is either crystalline or metal.

12. The laser rod of claim 9 wherein the dopant species is Zr.sup.4+.

* * * * *